United States Patent [19]

Maloney

[11] Patent Number: 5,719,737
[45] Date of Patent: Feb. 17, 1998

[54] VOLTAGE-TOLERANT ELECTROSTATIC DISCHARGE PROTECTION DEVICE FOR INTEGRATED CIRCUIT POWER SUPPLIES

[75] Inventor: Timothy J. Maloney, Palo Alto, Calif.

[73] Assignee: Intel Corporation, Santa Clara, Calif.

[21] Appl. No.: 621,129

[22] Filed: Mar. 21, 1996

[51] Int. Cl.⁶ ................................ H02H 3/22
[52] U.S. Cl. .................. 361/111; 361/56; 361/118
[58] Field of Search ................... 361/56, 91, 111, 361/118, 117, 115

[56] References Cited

U.S. PATENT DOCUMENTS

| | | | |
|---|---|---|---|
| 3,573,550 | 4/1971 | Baker, Jr. | 317/116 |
| 3,943,427 | 3/1976 | Tolstov et al. | 321/11 |
| 4,585,905 | 4/1986 | Brown | 179/16 AA |
| 5,311,391 | 5/1994 | Dungan et al. | 361/56 |
| 5,546,016 | 8/1996 | Allen | 326/30 |

FOREIGN PATENT DOCUMENTS

| | | | |
|---|---|---|---|
| 0 296 675 A2 | 6/1988 | European Pat. Off. | H01L 27/06 |
| 2 234 126 | 7/1990 | United Kingdom | H02H 9/04 |

OTHER PUBLICATIONS

"Mixed–Voltage Interface ESD Protection Circuits For Advanced Microprocessors In Shallow Trench and LOCOS Isolation CMOS Technologies," *IEEE*, Voldman et al., pp. 10.3.1–4, 1994.

*Primary Examiner*—Jeffrey A. Gaffin
*Assistant Examiner*—Stephen Jackson
*Attorney, Agent, or Firm*—Blakely, Sokoloff, Taylor & Zafman

[57] ABSTRACT

A method and an apparatus for protecting an integrated circuit from electrostatic discharge. In one embodiment, a voltage reduction circuit coupled to a termination circuit are coupled between a power supply and ground. The disclosed voltage reduction circuit utilizes a cantilevered diode string coupled to a clad network. Coupled to the voltage reduction circuit and the termination circuit is a voltage divider circuit which is coupled between the power supply and ground. The voltage supplied to the voltage reduction circuit and the termination circuit is a lower voltage than the steady state power supply voltage and is a tolerable voltage for gate oxides of a low voltage process. In another embodiment of the present invention, a voltage reduction circuit utilizing a stacked gate scheme is coupled between the power supply and ground. A voltage divider circuit is used in this embodiment to provide a bias voltage. The bias voltage is supplied to the voltage reduction circuit and a control circuit. The disclosed control circuit generates an output signal turning on the voltage reduction circuit during an ESD pulse and subsequently turning off the voltage reduction circuit after a period of time has elapsed after the ESD pulse. Accordingly, ESD protection is provided to the integrated circuit power supply of a low voltage process with minimal leakage current.

28 Claims, 5 Drawing Sheets

FIG_1 (PRIOR ART)

FIG_3

FIG_4

VOLTAGE-TOLERANT ELECTROSTATIC DISCHARGE PROTECTION DEVICE FOR INTEGRATED CIRCUIT POWER SUPPLIES

FIELD OF THE INVENTION

The present invention relates to electrostatic discharge protection circuits and more specifically, the present invention relates to a method and an apparatus for providing electrostatic discharge protection for integrated circuit power supplies.

RELATED APPLICATION

This application is related to co-pending application Ser. No. 08/218,747, filed Mar. 28, 1994, entitled "Electrostatic Discharge Protection Circuits Using Biased and Terminated PNP Transistor Chains," and assigned to the assignee of the present application.

BACKGROUND OF THE INVENTION

As is well known, the build-up of static charge may lead to extremely high voltages developed near an integrated circuit (IC). Electrostatic discharge (ESD) refers to the phenomenon of the electrical discharge of high current for short duration resulting from the build up of static charge on a particular IC package or on a nearby human being handling that particular IC package. Electrostatic discharge is a serious problem for semiconductor devices since it has the potential to destroy an entire integrated circuit. Since ESD events occur often across the silicon circuits attached to the package nodes, circuit designers have concentrated their efforts on developing adequate protection mechanisms for these sensitive circuits. Ideally, an ESD device should be able to protect an IC against any conceivable static discharge by passing large currents in a short time in a non-destructive manner.

FIG. 1 shows a prior art electrostatic discharge protection circuit 101 for integrated circuit power supplies. Circuit 101 is described in detail in co-pending patent application Ser. No. 08/218,747, filed Mar. 28, 1994, entitled "Electrostatic Discharge Protection Circuits Using Biased and Terminated PNP Transistor Chains," assigned to the assignee of the present invention. Circuit 101 employs a six stage cantilevered diode string 129 with a resistive bias network comprising transistors 123 and 125 and a termination circuit comprising transistor 121. The cantilevered diode termination, transistor 121, sinks a substantial amount of current over the time of an ESD pulse occurring on the power supply, $V_{CC}$ 109. After a period of time has elapsed after the initiation of the ESD pulse, the gate of transistor 121 is eventually pulled high after capacitor C1 is charged through transistor 113, thereby effectively switching off transistor 121.

Although ESD protection devices such as circuit 101 are used commonly to protect integrated circuit power supplies from electrostatic discharge, circuit designers may be unable to use a device such as circuit 101 in low voltage integrated circuit processes because of the relatively low voltages which can be tolerated by single gate oxides in those low voltage processes. In particular, modern integrated circuits such as microprocessors commonly employ multiple power supplies having different voltages. The existence of multiple power supplies in microprocessors, for example, is a result of a continuing trend towards smaller devices to increase circuit speed and packing density. To achieve this, devices are "scaled" or reduced in dimension. One consequence of this is that gate oxide thicknesses are reduced proportionally. As a result, the amount of voltage that can be tolerated by such devices is also decreased. However, other chips in a computer often operate at higher voltages than microprocessor core circuitry, such as for example I/O circuitry. Therefore, in order to remain compatible and operate reliably with such I/O circuitry in the computer system, the peripheral circuitry of a microprocessor must operate at a higher voltage than the core circuitry of that microprocessor. Thus, multiple power supplies having different voltages are often utilized by integrated circuits.

Referring back to prior art circuit 101 of FIG. 1, circuit designers may be unable to use the ESD protection device circuit 101 if $V_{CC}$ 109 is taken to a high nominal voltage, for example 5 volts, because of gate dielectric breakdown which may occur at single gate oxides. In steady state, ESD protection circuit 101 sustains a power supply voltage across thin oxide capacitor 119 as well as across the gate to drain of the terminating transistor 121. Therefore, the steady state voltage of the power supply $V_{CC}$ 109 must be compatible with the tolerable voltage of a single gate oxide. If the steady state voltage of $V_{CC}$ 109 is excessive, the single gate oxides at capacitor 119 and the gate to drain of transistor 121 may suffer gate dielectric breakdown.

Therefore, what is needed is a voltage tolerant electrostatic discharge protection device for integrated circuit power supplies. Such an ESD protection device would provide an ESD power supply clamp compatible with mixed voltage integrated circuits in which the tolerable voltage across a single gate oxide is less than the steady state voltage of the higher voltage power supply of the mixed voltage integrated circuit product.

SUMMARY OF THE INVENTION

A method and an apparatus for protecting an integrated circuit from electrostatic discharge is disclosed. In one embodiment, a voltage reduction circuit is configured to operate as an electrostatic discharge power supply clamp and is coupled to a power supply. A termination circuit is coupled between the voltage reduction circuit and ground. A voltage divider circuit is coupled between the power supply and ground and is configured to provide a bias voltage to the disclosed termination circuit and voltage termination circuit. Additional features and benefits of the present invention will become apparent from the detailed description, figures and claims set forth below. Other features and advantages of the present invention will be apparent from the accompanying drawings and from the detailed description which follows below.

BRIEF DESCRIPTION OF THE DRAWINGS

The present invention is illustrated by way of example and not limitation in the accompanying figures.

DETAILED DESCRIPTION

A method and an apparatus for protecting an integrated circuit from electrostatic discharge is disclosed. In the following description, numerous specific details are set forth such as specific devices, resistances, channel lengths, etc. in order to provide a thorough understanding of the present invention. It will be obvious, however, to one having ordinary skill in the art that the specific details need not be employed to practice the present invention. In other instances, well known materials or methods have not been described in detail in order to avoid unnecessarily obscuring the present invention.

As described earlier, integrated circuits such as microprocessors are becoming increasingly smaller and faster. Due to the reduced dimensions of integrated circuit devices, such as the circuitry found in the core of the microprocessors, the power supply voltage which can be tolerated at the single gate oxides in the core of such a microprocessor having a low voltage process is constantly decreasing. However, in order to maintain compatibility with previous generations of products, it is common to have other circuitry, such as I/O circuitry, run at a higher voltage than the core circuitry of a microprocessor. Accordingly, the periphery circuitry of the microprocessor must operate at a higher voltage than the core circuitry of the microprocessor in order to remain compatible and operate reliably with the I/O circuitry in a computer system. With this consideration in mind, it is likely that the single gate oxides of the low voltage processes are less likely to have the ability to tolerate the higher voltage power supplies in a mixed power supply process.

As indicated earlier, prior art electrostatic discharge protection circuits for integrated circuit power supplies may not address the issues presented with mixed voltage power supplies in low voltage integrated circuit processes. That is, the single gate oxides found in prior art electrostatic discharge protection devices are unable to tolerate the higher voltage power supplies of mixed voltage integrated circuits.

The present invention described herein provides a voltage tolerant ESD power supply clamp which protects IC power supplies in low voltage integrated circuit processes. Excessively high steady state power supply voltages are not applied to the low voltage process single gate oxides of the present invention.

Figure 2:
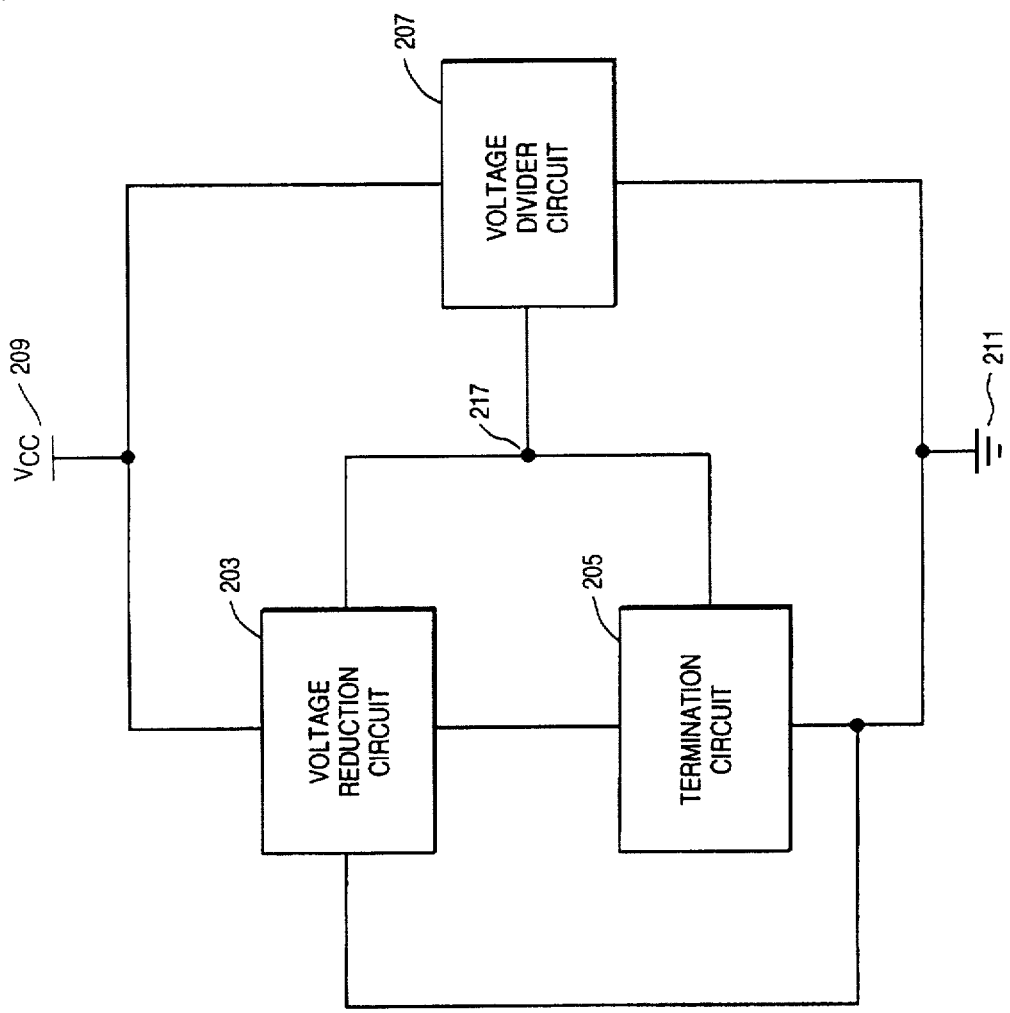
FIG. 2 is an illustration of one embodiment of the present invention in block diagram form.

In FIG. 2, the present invention, ESD power supply clamp 201, is illustrated in block diagram form. As indicated above, the present invention is fabricated in a low voltage process. Voltage reduction circuit 203 is coupled to power supply $V_{CC}$ 209. Termination circuit 205 is coupled between voltage reduction circuit 203 and ground. Voltage reduction circuit 203 in conjunction with termination circuit 205 protect the associated integrated circuit and integrated circuit power supply during an ESD pulse. With voltage divider circuit 207 coupled between the power supply $V_{CC}$ 209 and ground 211, a bias voltage is generated at node 217 which is coupled to the voltage dissipation and termination circuits 203 and 205.

Assuming that the single gate oxides of ESD power supply clamp 201 are unable to tolerate the high voltage potential of $V_{CC}$ 209, the single gate oxides are nevertheless protected from the excessively high steady state voltage found at $V_{CC}$ 209. The bias voltage produced at node 217 as well as the voltage difference between $V_{CC}$ 209 and node 217 are tolerable for the single gate oxides of the present invention.

Another feature of the voltage divider circuit 207 of the present electrostatic discharge protection device 201 is that voltage divider circuit 207 also acts as a timer circuit. In one embodiment, a capacitor is employed in voltage divider circuit 207 to realize timer circuit functionality. Voltage divider circuit 207 adjusts the bias voltage found at node 217 such that termination circuit 205 is configured to sink a substantial amount of current from the voltage reduction circuit 203 at the initiation of an ESD pulse and then discontinue sinking the substantial amount of current after a period of time has elapsed subsequent to the initiation of the ESD pulse.

Figure 3:
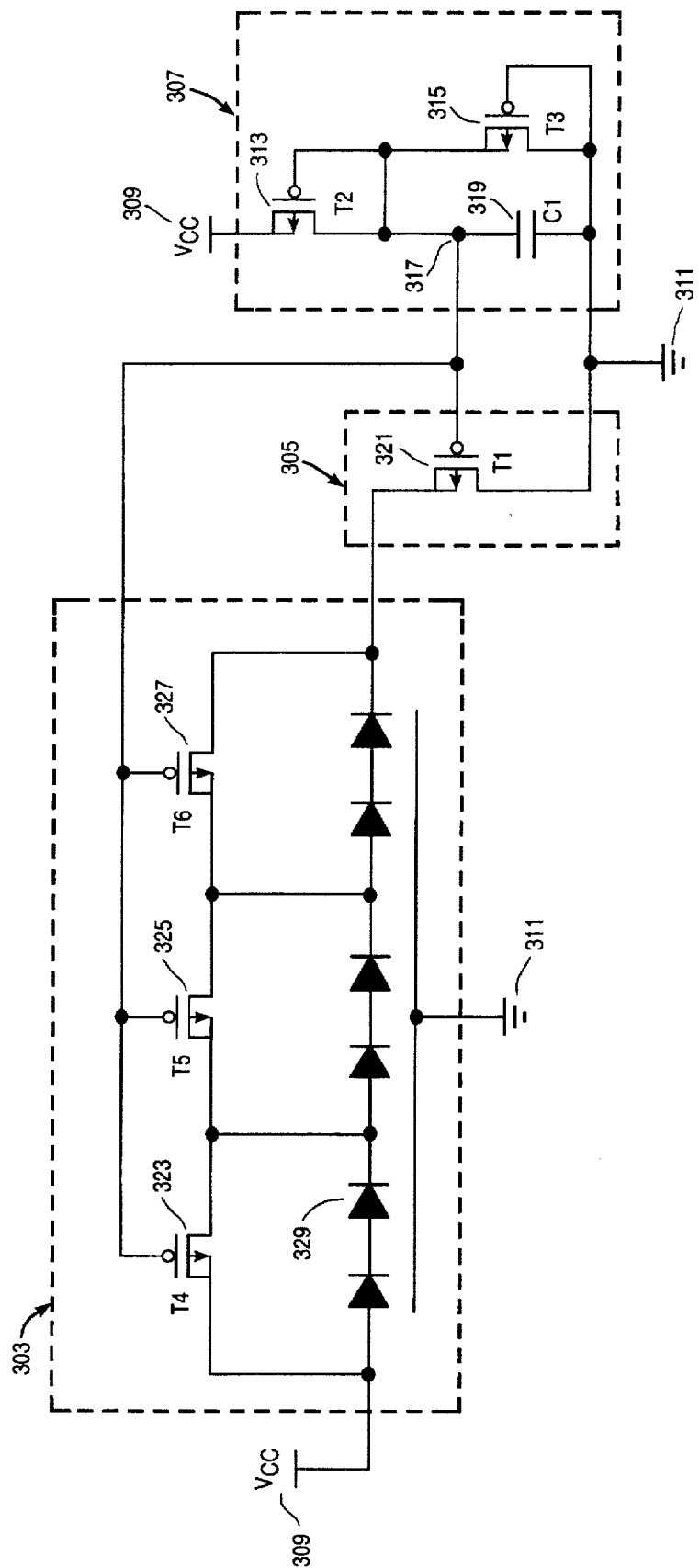
FIG. 3 is an illustration of a schematic of one embodiment of the present invention.

FIG. 3 shows a schematic of one embodiment of the present invention, ESD power supply clamp 301. As shown in FIG. 3, voltage reduction circuit 303 is coupled to power supply $V_{CC}$ 309 with termination circuit 305 coupled between the voltage reduction circuit 303 and ground 311. Voltage divider circuit 307 is coupled between power supply $V_{CC}$ 309 and ground 311 and supplies a bias voltage at node 317 which is coupled to voltage reduction circuit 303 and termination circuit 305.

In the embodiment shown in FIG. 3, voltage reduction circuit 303 employs a cantilever power supply clamp utilizing a conventional six stage cantilevered diode string. Cantilevered diode string 329 includes a set of serially coupled diodes utilized to protect an integrated circuit from an ESD pulse occurring on the power supply $V_{CC}$ 309. It is appreciated that although a six stage cantilevered diode clamp is utilized by the present invention, the cantilevered string is not limited to six.

As also shown in FIG. 3, a bias network, or clad network, comprising transistors T4-T6, transistors 323, 325 and 327, is coupled to the cantilevered diode string 329. Transistors, 323, 325 and 327 are biased with the voltage supplied at node 317 to operate as cladded resistors. The clad network biases the diodes of the cantilevered diode string 329 in a weak forward bias and thereby drops much of the excess voltage resulting from an ESD pulse.

Cantilevered diode strings and the associated cladded resistors are described in detail in co-pending application Ser. No. 08/218,747, filed Mar. 28, 1994, entitled "Electrostatic Discharge Protection Circuits Using Biased and Terminated PNP Transistors Chains," assigned to the assignee of the present invention.

Figure 1:
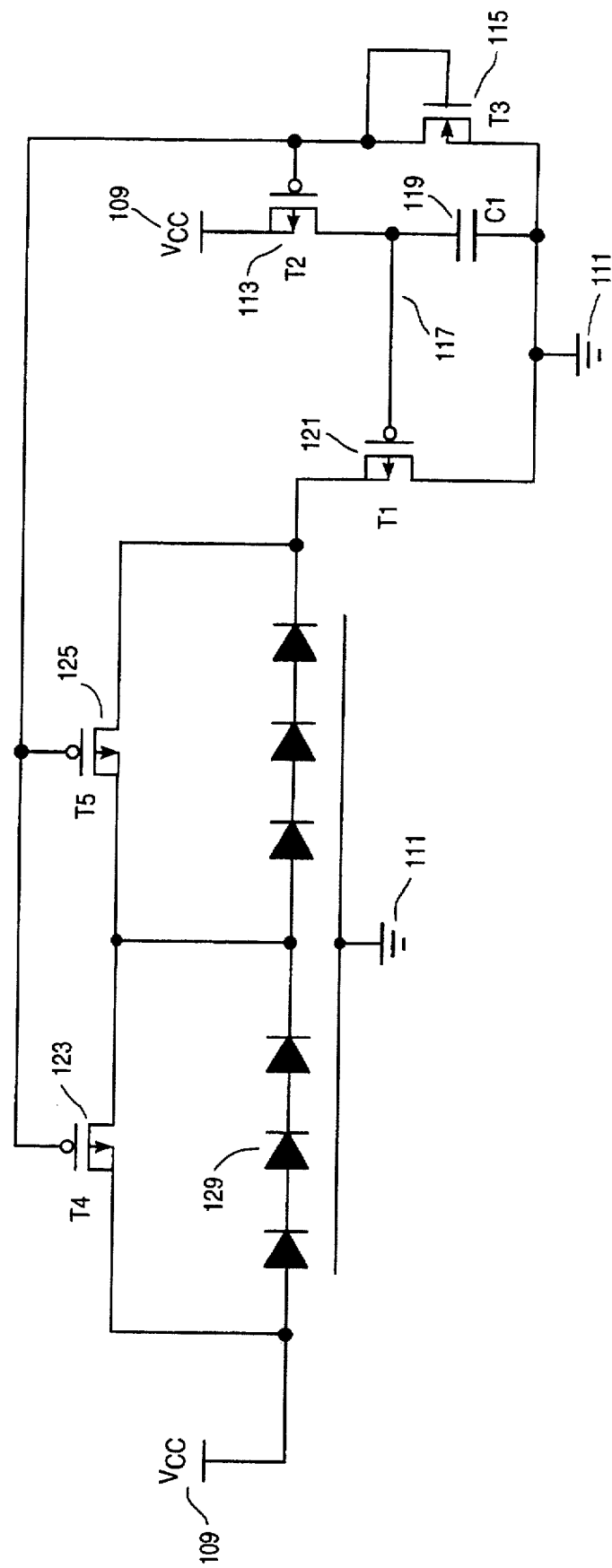
FIG. 1 is an illustration of a prior art electrostatic discharge protection circuit for an integrated circuit power supply.

At the initiation and over the time of an ESD pulse, the PNP diode chain 329 (with distributed p-collector at ground 311) forward bias and conduct most of the ESD current to ground as in the prior art cantilever clamp 101 of FIG. 1. The current left at the end of the PNP diode chain 329 goes into p-channel transistor 321, which during the ESD pulse has its gate node 317 held at ground by capacitor 319, thereby turning on transistor 321. After a period of time has elapsed after the initiation of an ESD pulse, transistor 321 is held in subthreshold mode with the gate voltage supplied by node 317 of the voltage divider circuit 307. This voltage, compared with supply voltage $V_{CC}$ 309, is such that the diodes in diode chain 329 can all be held in weak forward bias (with bias transistors 323, 325, 327 helping to equalize the voltages) so that when these diode voltages are added to a subthreshold voltage for transistor 321, the difference between $V_{CC}$ 309 and the bias voltage at node 317 is equalled. Conditions are such that the total $V_{CC}$ 309 leakage current to ground in steady state is minimal, owing largely to the weak forward biasing of all of diodes in diode chain 329, whereby substantial voltage (e.g., 0.4 to 0.6 volts per diode depending on temperature) can be supported with very little (e.g., nanoamps) of current.

In the embodiment shown of the present ESD power supply clamp 301, voltage divider circuit 307 is comprised of transistor 313 coupled between power supply $V_{CC}$ 309 and transistor 315. Transistor 315 is coupled between transistor 313 and ground. In the embodiment shown in FIG. 3, transistors 313 and 315 are long channel PMOS devices with gate and drain attached. Capacitor 319 is coupled in parallel across transistor 315 and ground.

As long channel devices, transistors 313 and 315 establish a bias voltage at a potential tolerable by a single gate oxide at node 317. In particular, voltage divider circuit 307 establishes a tolerable bias voltage across the thin oxide capacitor 319 and the transistor 321 gate to drain junction. It is further noted that since transistors 313 and 315 are long channel transistors with relatively high impedance, transistors 313 and 315 leak to ground a minimal amount of current.

At the initiation of an ESD pulse on power supply $V_{CC}$ 309, capacitor 319 initially holds the gate of transistor 321 low to allow the termination circuit to sink a substantial amount of current. Afterwards, thin oxide capacitor 319 is pulled up by long channel transistor 313 to bias transistor 321 at subthreshold after a period of time determined by the RC time constant established by capacitor 319 in parallel with the effective resistance of transistors 313 and 315. In one embodiment of the present invention, the RC time constant is dominated by the effective resistance of transistor 313 and results in an RC time constant of 1 microsecond or more.

One embodiment of the ESD power supply clamp 301 shown in FIG. 3 is utilized as a 5 volt ESD clamp. In other embodiments, ESD power supply clamp 301 may be used as a 3.3 volt ESD clamp or a 2.5 volt ESD clamp. Furthermore, a 10 percent voltage tolerance limit on $V_{CC}$ 309 is allowable with one embodiment of ESD power supply clamp 301. In an embodiment with $V_{CC}$ 309 equal to approximately 5 volts, long channel transistors 313 and 315 establish a steady state bias voltage at node 317 at about 3.2 volts. In the embodiment with $V_{CC}$ 309 equal to approximately 3.3 volts, node 317 is biased at about 1.65 volts. In the embodiment with $V_{CC}$ 309 equal to approximately 2.5 volts, node 317 is biased at about 1.25 volts. In each embodiment, gate oxide voltages are maintained at tolerable potentials and minimal leakage current flows between $V_{CC}$ 309 and ground 311.

In one embodiment, transistor 321 has dimensions with a gate width of 792 microns and length of 1 micron, transistor 313 has a gate width of 1 micron and a length of 20 microns, transistor 315 has a gate width of 1 micron and a length of 85 microns, transistor 323 has a gate width of 1 micron and a length of 21 microns, transistor 325 has a gate width of 1 micron and a length of 20 microns and transistor 327 has a gate width of 1 micron and a length of 8 microns.

Accordingly, the present invention adapts the prior art cantilevered diode clamp design in an area efficient way to utilize the higher voltage power supply to bias safely single gate oxides and weak forward bias the series of diodes in a cantilevered diode string such that leakage current is low and tolerable.

Figure 4:
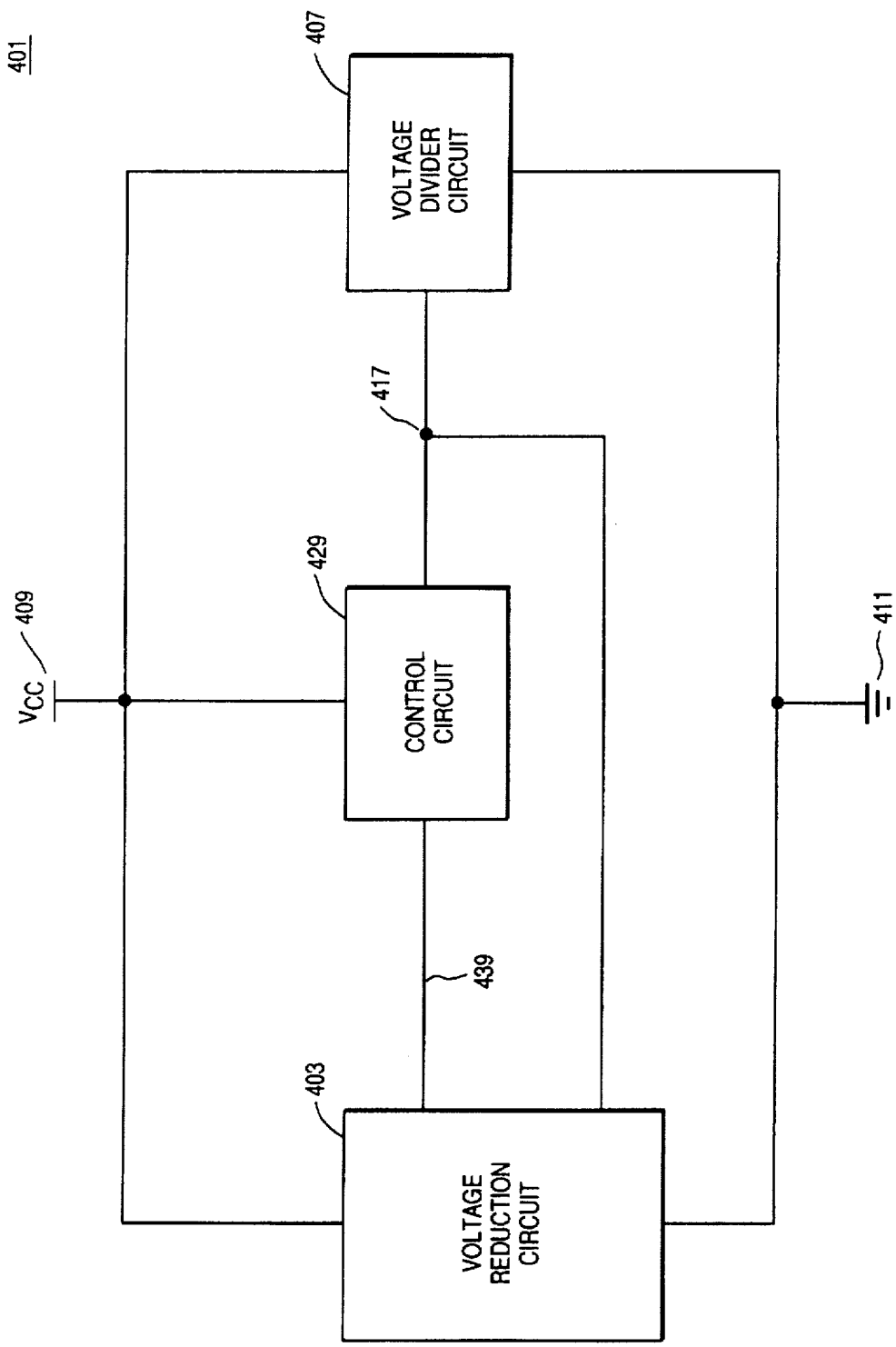
FIG. 4 is another embodiment of the present invention illustrated in block diagram form.

In FIG. 4, an alternative embodiment of the present ESD power supply clamp 401 is shown in block diagram form. ESD power supply clamp 401 is comprised of a voltage reduction circuit 403 coupled between power supply $V_{CC}$ 409 and ground 411. Voltage divider circuit 407 is also coupled between power supply $V_{CC}$ 409 and ground 411 to produce a bias voltage at node 417 which is tolerable to the single gate oxides of the low voltage process. Node 417 is coupled to voltage reduction circuit 403 and control circuit 429. Control circuit 429 generates output 439 which is also coupled to voltage reduction circuit 403. Similar to the embodiments described with respect to FIGS. 2 and 3, voltage reduction circuit 403 sinks a substantial amount of current at the initiation of and during an ESD pulse. Voltage divider circuit 407 generates a bias voltage at node 417 which is tolerable by single gate oxides of a low voltage process. Control circuit 429 generates an output 439 which causes voltage reduction circuit 403 effectively not to conduct current during a steady state voltage at power supply $V_{CC}$ 409. However, control circuit 429 generates an output 439 which causes voltage reduction circuit 403 to sink a substantial amount of current at the initiation of and during an ESD pulse. After a period of time has elapsed after the initiation of the ESD pulse, output 439 causes voltage reduction circuit 403 to discontinue effectively conducting the substantial amount of current.

Figure 5:
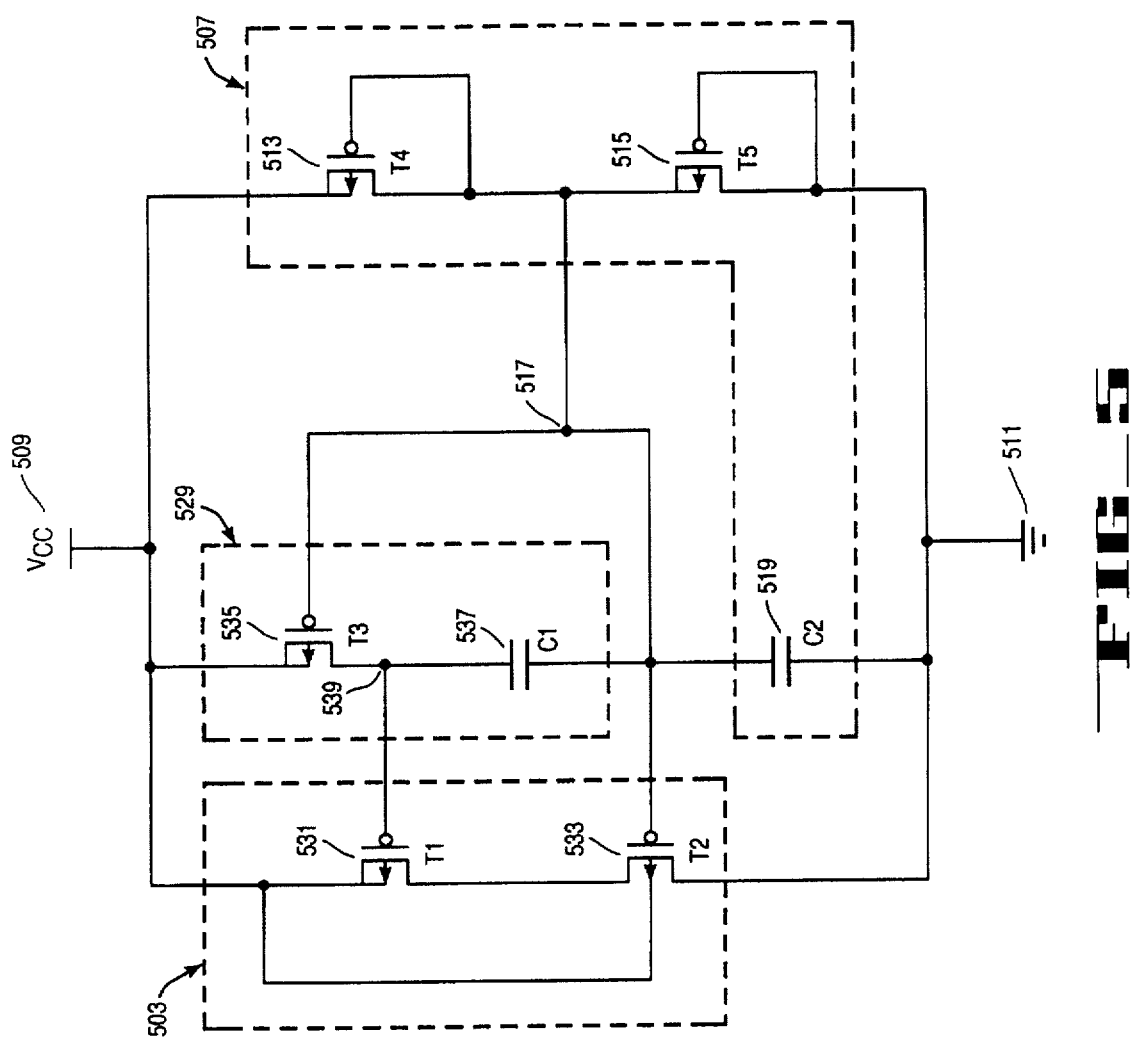
FIG. 5 is a schematic of another embodiment of the present invention.

FIG. 5 shows a schematic of the alternate embodiment of the present invention, ESD power supply clamp 501. ESD power supply clamp 501 is comprised of voltage reduction circuit 503 coupled between power supply $V_{CC}$ 509 and ground 511. Voltage divider circuit 507 is also coupled between power supply $V_{CC}$ 509 and ground 511 and supplies a bias voltage at node 517 which is received by control circuit 529 and voltage reduction circuit 503. Control circuit 529 generates an output at node 539 which causes voltage reduction circuit 503 to conduct a substantial amount of current at the initiation of and during an ESD pulse. Control circuit 529 also causes voltage reduction circuit 503 effectively not to conduct the substantial amount of current after a period of time has elapsed from the initiation of the ESD pulse.

In the embodiment shown in FIG. 5, voltage reduction circuit 503 is comprised of transistors 531 and 533 coupled between power supply $V_{CC}$ 509 and ground 511. Transistors 531 and 533 are configured in a stacked gate scheme to protect power supply $V_{CC}$ 509. In the embodiment shown in FIG. 5, transistor 533 is a double gate FET as the well of transistor 533 is coupled to $V_{CC}$ with the well of transistor 531. Thus, transistors 531 and 533 share the same well. It is noted that transistors 531 and 533 may be fabricated in separate wells in order to accommodate the situation of an exceedingly high steady state power supply voltage present at $V_{CC}$ 509. In one embodiment of ESD power supply clamp 501, $V_{CC}$ 509 is 2.5 volts which allows the double gate FET configuration to be possible since junction breakdown is not a problem.

Similar to the embodiment shown in FIG. 3, voltage divider circuit 507 is comprised of long channel transistors 513 and 515 coupled between power supply $V_{CC}$ 509 and ground 511. As long channel devices with gate and drain attached, transistors 513 and 515 have relatively high impedance and therefore leak to ground a minimal amount of current. Capacitor 519 is coupled in parallel across transistor 515 between transistor 513 and ground 511. Transistors 513 and 515 establish a bias voltage at a tolerable potential across the thin gate oxide of capacitor 519 and the single gate oxide of the gate to drain junction of transistor 533.

In one embodiment, ESD power supply clamp 501 is utilized as a 5 volt ESD clamp with a 10 percent voltage tolerance limit. Accordingly, $V_{CC}$ 509 is equal to 5 volts and node 517 is biased to about 2.5 volts. In other embodiments, ESD power supply clamp 501 may be used as a 3.3 volt or a 2.5 volt ESD clamp with a 10 percent voltage tolerance limit on $V_{CC}$ 509. In the embodiment with $V_{CC}$ 509 equal to 3.3 volts, node 517 is biased at about 1.65 volts and in the embodiment with $V_{CC}$ 509 equal to 2.5 volts, node 317 is biased at about 1.25 volts.

The control circuit 529 is comprised of transistor 535 coupled between power supply $V_{CC}$ 509 and capacitor 537.

Capacitor 537 is coupled between transistor 535 and node 517. The gate of transistor 529 is coupled to receive the bias voltage produced at node 517. Control circuit 529 generates output at node 539 which is received at the gate of transistor 531 of voltage reduction circuit 503.

While in steady state, voltage divider circuit 507 of ESD power supply clamp 501 biases the gates of transistors 535 and 533 thereby turning on transistors 533 and 535. Accordingly, capacitor 537 is charged high therefore causing control circuit 529 to generate a high output at node 539 thereby turning off transistor 531. Since transistors 531 and 533 are coupled in series between $V_{CC}$ 509 and ground 511, and since transistor 531 is turned off, the leakage current of voltage reduction circuit 503 during steady state is minimal. In one embodiment with $V_{CC}$ 509 set to 2.5 volts, the gates of transistors 535 and 533 are biased at approximately 1.25 volts.

At the initiation of and during an ESD impulse, capacitor 537 initially keeps the voltage at node 539 low in comparison with the ESD pulse voltage present on $V_{CC}$ 509. Thus, transistor 531 is switched on which enables voltage reduction circuit 503 to sink a substantial amount of current over the time of the ESD pulse. However, after a period of time, transistor 535 eventually charges capacitor 537 thereby resulting in a high voltage at output 539 thereby turning off transistor 531. Accordingly, control circuit 529 causes the voltage reduction circuit 503 effectively not to sink the substantial amount of current after a period of time.

In one embodiment of ESD power supply clamp 501, transistors 531 and 533 have a gate width of 4,165 microns and a length of 0.6 microns, transistor 535 is a long channel PMOS clamp with a gate width of 1 micron and a length of 40 microns, transistor 513 has a gate width of 1 micron and a length of 20 microns and transistor 515 has a gate width of 1 micron and a length of 40 microns. $V_{CC}$ is 2.5 volts in the described embodiment.

Thus, with ESD power supply clamp 501, a voltage tolerant electrostatic discharge protection device for integrated circuit power supplies is realized. With ESD power supply clamp 501, ESD protection is provided for integrated circuit power supplies of low voltage processes without having to expose single gate oxides to exceedingly high steady state voltages.

In the foregoing detailed description, an apparatus and a method for protecting an integrated circuit from electrostatic discharge is described. The apparatus and method of the present invention has been described with reference to specific exemplary embodiments thereof. It will, however, be evident that various modifications and changes may be made thereto without departing from the broader spirit and scope of the present invention. The present specification and drawings are accordingly to be regarded as illustrative rather than restrictive.

What is claimed is:

1. A device for protecting an integrated circuit from electrostatic discharge comprising:
   a voltage reduction circuit coupled to a first potential, the voltage reduction circuit configured so as to operate as a electrostatic discharge power supply clamp;
   a termination circuit coupled between the voltage reduction circuit and a second potential, the termination circuit including a first transistor coupled between the voltage reduction circuit and the second potential, the first transistor having a gate coupled to a voltage divider circuit; and
   the voltage divider circuit coupled to the termination circuit and between the first and second potentials, the voltage divider configured so as to bias a termination circuit to a third potential.

2. The device described in claim 1 wherein the termination circuit is configured so as to sink a substantial amount of current from the voltage reduction circuit in response to an initiation of an electrostatic discharge pulse, the termination circuit configured so as to discontinue sinking the substantial amount of current from the voltage reduction circuit after a period of time has elapsed after the initiation of the electrostatic discharge pulse.

3. The device described in claim 1 wherein the first potential is approximately 5 volts, the second potential is ground and the third potential is approximately 3.2 volts.

4. The device described in claim 1 wherein the first potential is approximately 3.3 volts, the second potential is ground and the third potential is approximately 1.65 volts.

5. The device described in claim 1 wherein the first potential is approximately 2.5 volts, the second potential is ground and the third potential is approximately 1.25 volts.

6. The device described in claim 1 wherein the voltage reduction circuit includes a cantilever diode string coupled to a bias network.

7. The device described in claim 6 wherein the cantilever diode string includes a set of serially coupled diodes.

8. The device described in claim 6 wherein the bias network includes cladded resistors configured to bias the cantilever diode string.

9. The device described in claim 1 wherein the voltage divider circuit includes serially coupled first and second divider circuit coupled between the first and second potentials, the voltage divider circuit further including a capacitor coupled in parallel across one of the first and second resistors to the second potential, the capacitor and first and second resistors coupled to the termination circuit.

10. The device described in claim 9 wherein the capacitor includes a capacitor gate oxide, the voltage divider circuit further configured so as to prevent the excessive voltage from being provided to the capacitor gate oxide.

11. The device described in claim 9 wherein the first and second resistors are comprised of second and third transistors configured as long channel devices with gate and drain attached.

12. A method of providing electrostatic discharge protection of an integrated circuit power supply using a power supply clamp, the method comprising the steps of:
   dissipating an electrostatic discharge pulse from the integrated circuit power supply with a voltage reduction circuit;
   terminating the voltage reduction circuit with a termination circuit wherein the termination circuit includes a gate oxide;
   biasing the gate oxide with a voltage divider circuit so as to prevent an excessive voltage from being provided to the gate oxide;
   sinking a substantial amount of current from the voltage reduction circuit in response to an initiation of an electrostatic discharge pulse; and
   discontinue sinking the substantial amount of current from the voltage reduction circuit after a period of time in response to the voltage divider circuit.

13. The method described in claim 12 wherein the termination circuit includes a first transistor having the gate oxide coupled between the voltage divider circuit and ground, the first transistor having a source and a drain coupled between the voltage reduction circuit and ground.

14. The method described in claim 12 wherein the voltage divider circuit includes serially coupled first and second resistors coupled between a first potential and a second potential, the voltage divider circuit further including a capacitor coupled in parallel across one of the first and second resistors to the second potential, the capacitor and first and second resistors coupled to the termination circuit.

15. The method described in claim 14 wherein the capacitor includes a capacitor gate oxide, the voltage divider circuit further configured so as to prevent the excessive voltage from being provided to the capacitor gate oxide.

16. The method described in claim 15 wherein the first and second resistors are comprised of second and third transistors configured as long channel devices with gate and drain attached.

17. A device for protection an integrated circuit from electrostatic discharge comprising:

a voltage reduction circuit coupled between a first potential and a second potential, the voltage reduction circuit configured to operate as a electrostatic discharge power supply clamp;

a voltage divider circuit coupled to the voltage reduction circuit and between the first and second potentials, the voltage divider configured so as to bias a termination circuit at a third potential.

a control circuit coupled to the voltage reduction circuit between the first potential and the voltage divider circuit, the control circuit configured so as to cause the voltage reduction circuit to sink a substantial amount in response to an initiation of an electrostatic discharge pulse and to discontinue sinking the substantial amount of current after a period of time has elapsed after the initiation the electrostatic discharge pulse.

18. The device described in claim 17 wherein the voltage reduction circuit includes a gate oxide, the voltage divider circuit configured so as to prevent an excessive voltage from being applied to the gate oxide.

19. The device described in claim 17 wherein the control circuit includes a fifth transistor coupled between the first potential and a second capacitor, the second capacitor and a gate of the fifth transistor coupled to the voltage divider circuit.

20. The device described in claim 17 wherein the first potential is approximately 5 volts, the second potential is ground and the third potential is approximately 2.5 volts.

21. The device described in claim 17 wherein the first potential is approximately 3.3 volts, the second potential is ground and the third potential is approximately 1.65 volts.

22. The device described in claim 17 wherein the first potential is approximately 2.5 volts, the second potential is ground and the third potential is approximately 1.25 volts.

23. The device described in claim 17 wherein the voltage divider circuit includes serially coupled first and second resistors coupled between the first and second potentials, the voltage divider circuit further including a first capacitor coupled in parallel across one of the first and second resistors to the second potential, the capacitor and first and second resistors coupled to the voltage reduction circuit.

24. The device described in claim 23 wherein the first capacitor includes a capacitor gate oxide, the voltage divider circuit further configured so as to prevent the excessive voltage from being provided to the capacitor gate oxide.

25. The device described in claim 23 wherein the first and second resistors are comprised of first and second transistors configured as long channel devices with gate and drain attached.

26. The device described in claim 17 wherein the voltage reduction circuit includes a stacked-gate scheme having third and fourth transistors.

27. The device described in claim 26 wherein a gate of the third transistor is coupled to the control circuit and a gate of the fourth transistor is coupled to the voltage divider circuit and the control circuit.

28. The device described in claim 27 wherein the third and fourth transistors are a double-gate field effect transistor.

* * * * *